United States Patent
Pahwa et al.

(10) Patent No.: US 10,275,172 B2
(45) Date of Patent: Apr. 30, 2019

(54) SOLID STATE DRIVE DEVICES AND METHODS OF OPERATING THEREOF

(71) Applicant: Samsung Electronics Co., Ltd., Suwon-si (KR)

(72) Inventors: Shiva Pahwa, Hwaseong-si (KR); Alex Mohandas, Hwaseong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 91 days.

(21) Appl. No.: 15/412,302

(22) Filed: Jan. 23, 2017

(65) Prior Publication Data

US 2018/0032275 A1 Feb. 1, 2018

(30) Foreign Application Priority Data

Jul. 27, 2016 (KR) .................. 10-2016-0095772

(51) Int. Cl.

| | |
|---|---|
| *G06F 3/06* | (2006.01) |
| *G11C 11/56* | (2006.01) |
| *G11C 16/04* | (2006.01) |
| *G11C 16/16* | (2006.01) |
| *G11C 16/26* | (2006.01) |
| *G11C 16/30* | (2006.01) |

(Continued)

(52) U.S. Cl.
CPC .......... *G06F 3/0634* (2013.01); *G06F 3/0611* (2013.01); *G06F 3/0649* (2013.01); *G06F 3/0679* (2013.01); *G11C 7/1045* (2013.01); *G11C 11/5621* (2013.01); *G11C 11/5628* (2013.01); *G11C 16/0483* (2013.01); *G11C 16/16* (2013.01); *G11C 16/20* (2013.01); *G11C 16/26* (2013.01); *G11C 16/30* (2013.01); *G11C 29/028* (2013.01); *G11C 2029/0409* (2013.01)

(58) Field of Classification Search
CPC .... G06F 3/0634; G06F 3/0611; G06F 3/0679; G11C 11/5621; G11C 11/5628; G11C 11/0483; G11C 11/16; G11C 11/20; G11C 11/26; G11C 11/30; G11C 29/028; G11C 2029/0409; G11C 7/1045

See application file for complete search history.

(56) References Cited

U.S. PATENT DOCUMENTS 8,667,215 B2  3/2014 Marotta et al.
8,886,990 B2  11/2014 Meir et al.
(Continued)

FOREIGN PATENT DOCUMENTS

| JP | 2014-225196 A | 12/2014 |
| KR | 10-2014-0109689 A | 9/2014 |
| WO | WO 2014-185038 A1 | 11/2014 |

*Primary Examiner* — David Yi
*Assistant Examiner* — Tahilba O Puche
(74) *Attorney, Agent, or Firm* — Muir Patent Law, PLLC

(57) ABSTRACT

In a method of operating a SSD device, which includes a nonvolatile memory device having a plurality of memory blocks, the plurality of memory blocks is operated in a single level cell (SLC) mode, an access pattern for each of a plurality of data units stored in each of the plurality of memory blocks of the nonvolatile memory device is periodically analyzed, an operation mode of at least one of the plurality of memory blocks is switched to a multi level cell (MLC) mode based on the analysis result, and at least one of data units is moved to a memory block operating in the MLC mode based on the analysis result.

15 Claims, 15 Drawing Sheets

(51) Int. Cl.
*G11C 7/10* (2006.01)
*G11C 16/20* (2006.01)
*G11C 29/02* (2006.01)
*G11C 29/04* (2006.01)

(56) References Cited

U.S. PATENT DOCUMENTS

| | | | |
|---|---|---|---|
| 9,043,516 B2 | 5/2015 | Seo et al. | |
| 9,158,671 B2 | 10/2015 | Ryu et al. | |
| 9,208,079 B2 | 12/2015 | Oh et al. | |
| 9,223,694 B2 | 12/2015 | Seo et al. | |
| 9,274,893 B2 | 3/2016 | Chen | |
| 9,495,101 B2* | 11/2016 | Lieber | G06F 3/061 |
| 9,898,199 B2* | 2/2018 | Choi | G06F 3/061 |
| 2011/0252187 A1* | 10/2011 | Segal | G06F 12/0246 711/103 |
| 2011/0264843 A1* | 10/2011 | Haines | G06F 12/0246 711/103 |
| 2012/0072652 A1* | 3/2012 | Celis | G06F 12/121 711/103 |
| 2013/0024609 A1* | 1/2013 | Gorobets | G06F 12/0246 711/103 |
| 2013/0046917 A1 | 2/2013 | Yang et al. | |
| 2015/0193302 A1* | 7/2015 | Hyun | G11C 29/52 714/764 |
| 2015/0286406 A1 | 10/2015 | Maghraoui et al. | |
| 2015/0363308 A1 | 12/2015 | Park | |
| 2016/0041762 A1 | 2/2016 | Kanno et al. | |
| 2016/0179386 A1* | 6/2016 | Zhang | G06F 3/0679 711/103 |
| 2016/0306554 A1* | 10/2016 | Li | G06F 3/0604 |
| 2017/0024137 A1* | 1/2017 | Kanno | G06F 3/0604 |
| 2017/0177258 A1* | 6/2017 | Bates | G06F 3/0629 |

* cited by examiner

SOLID STATE DRIVE DEVICES AND METHODS OF OPERATING THEREOF

CROSS-REFERENCE TO RELATED APPLICATION(S)

This application claims priority under 35 USC § 119 to Korean Patent Application No. 10-2016-0095772, filed on Jul. 27, 2016 in the Korean Intellectual Property Office (KIPO), the contents of which are herein incorporated by reference in their entirety.

BACKGROUND

1. Technical Field

Example embodiments relate to a storage device, and more particularly to a solid state drive (SSD) device and a method of operating the SSD device.

2. Description of the Related Art

A hard disk drive (HDD) device is typically used as a data storage mechanism of an electronic device. Recently, a solid state drive (SSD) device including nonvolatile memory devices, such as flash memories, are being used instead of a HDD device as the data storage mechanisms of electronic devices.

In addition, a SSD device including nonvolatile memory devices of a multi level cell (MLC) scheme, in which two bits of data is stored in each memory cell, has been developed to increase a storage capacity.

However, an operation speed of a nonvolatile memory device of the MLC scheme is lower than an operation speed of a nonvolatile memory device of a single level cell (SLC) scheme. Therefore, it is desired nonvolatile memory devices properly combined of the SLC scheme and the MLC scheme for an effective operation speed and an effective storage capacity.

SUMMARY

Some example embodiments are directed to provide a solid state drive (SSD) device having a high operation speed while having a high storage capacity.

Some example embodiments are directed to provide a method of operating a SSD device having a high operation speed while having a high storage capacity.

According to example embodiments, in a method of operating a SSD device, which includes a nonvolatile memory device having a plurality of memory blocks, the plurality of memory blocks is operated in a single level cell (SLC) mode, an access pattern for each of a plurality of data units stored in each of the plurality of memory blocks of the nonvolatile memory device is periodically analyzed, an operation mode of at least one of the plurality of memory blocks is switched to a multi level cell (MLC) mode based on the analysis result, and at least one of the plurality of data units is moved to a memory block operating in the MLC mode based on the analysis result.

According to example embodiments, in a method of operating a SSD device, which includes a nonvolatile memory device having a plurality of memory blocks, an access pattern for each of a plurality of data units stored in the nonvolatile memory device is periodically analyzed to determine each of the plurality of data units as one of a hot data, a warm data, and a cold data, the hot data is moved to a memory block operating in a single level cell (SLC) mode among the plurality of memory blocks when the hot data is stored in one of a memory block operating in a multi level cell (MLC) mode and a memory block operating in a triple level cell (TLC) mode among the plurality of memory blocks, the warm data is moved to the memory block operating in the MLC mode among the plurality of memory blocks when the warm data is stored in one of the memory block operating in the SLC mode and the memory block operating in the TLC mode among the plurality of memory blocks, and the cold data is moved to the memory block operating in the TLC mode among the plurality of memory blocks when the cold data is stored in one of the memory block operating in the SLC mode and the memory block operating in the MLC mode among the plurality of memory blocks. The periodically analyzing the access pattern includes periodically determining a number of accesses for one of the data units stored in each of the plurality of memory blocks. The hot data refers to data having a number of accesses equal to or greater than a first reference value, the warm data refers to data having a number of accesses equal to or greater than a second reference number and less than the first reference value, and the cold data refers to data having a number of accesses less than the second reference value.

According to example embodiments, there is provided a method of operating a SSD device, which includes a nonvolatile memory device having a plurality of memory blocks, including performing a number of accesses for each of a plurality of data units stored in each memory block of the plurality of memory blocks, and switching an operation mode of at least one of the plurality of memory blocks from one of a single level cell (SLC) mode, a multi level cell (MLC) mode, and a triple level cell (TLC) mode to a different one of the SLC mode, the MLC mode, and the TLC mode based on the number of accesses.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as "at least one of," when preceding a list of elements, modify the entire list of elements and do not modify the individual elements of the list.

Figure 1:
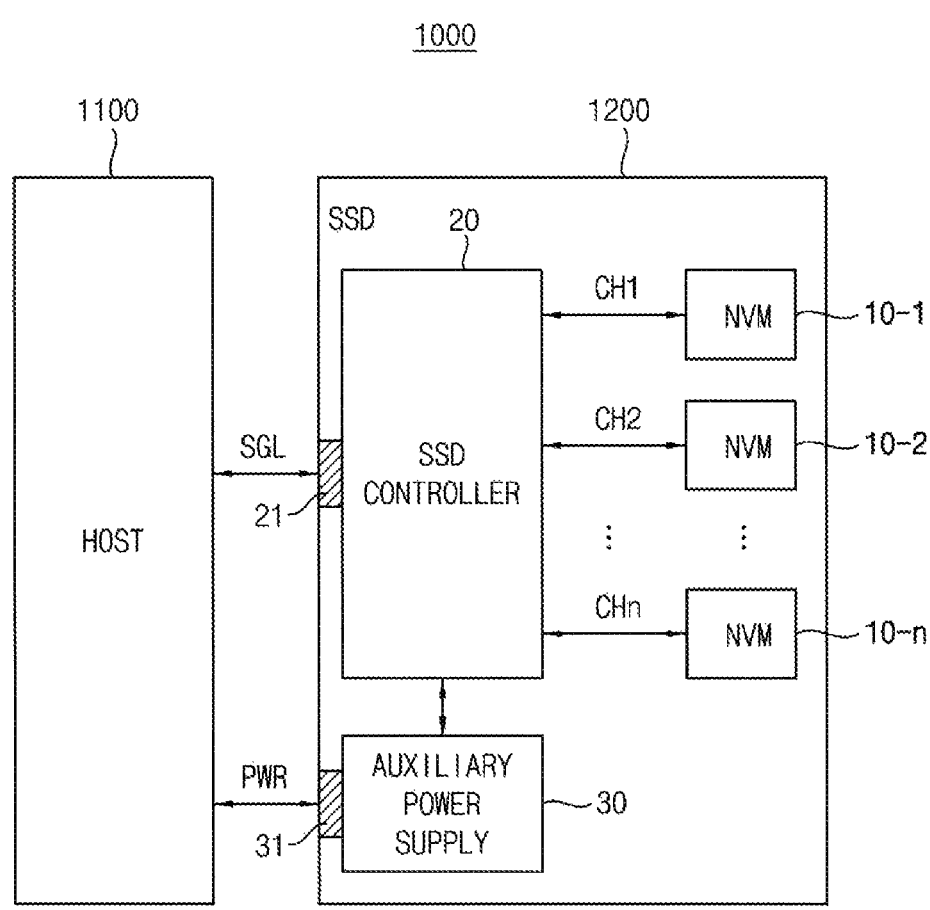
FIG. 1 is a block diagram illustrating a solid state drive (SSD) system according to example embodiments.

FIG. 1 is a block diagram illustrating a solid state drive (SSD) system according to example embodiments.

Referring to FIG. 1, a SSD system 1000 includes a host 1100 and a SSD device 1200.

The SSD device 1200 may include first through n-th nonvolatile memory devices 10-1, 10-2, . . . , 10-n and a SSD controller 20.

The first through n-th nonvolatile memory devices 10-1, 10-2, . . . , 10-n may be used as a storage medium of the SSD device 1200.

In some example embodiments, each of the first through n-th nonvolatile memory devices 10-1, 10-2, . . . , 10-n may include a flash memory device.

In other example embodiments, each of the first through n-th nonvolatile memory devices 10-1, 10-2, . . . , 10-n may include a plurality of flash memory devices.

The SSD controller 20 may be coupled to the first through n-th nonvolatile memory devices 10-1, 10-2, . . . , 10-n by first through n-th channels CH1, CH2, . . . , CHn, respectively.

In one example, the SSD controller 20 may simultaneously communicate with the first through n-th nonvolatile memory devices 10-1, 10-2, . . . , 10-n through first to n-th channels CH1, CH2, . . . , CHn. In another example, the SSD controller 20 may selectively communicate with one of the first through n-th nonvolatile memory devices 10-1, 10-2, . . . , 10-n through one of the first to n-th channels CH1, CH2, . . . , CHn.

The SSD controller 20 may exchange a signal SGL with the host 1100 through a signal connector 21. The signal SGL may include a command, an address and data. The SSD controller 20 may perform a program operation and a read operation on the first through n-th nonvolatile memory devices 10-1, 10-2, . . . , 10-n according to the command received from the host 1100.

The SSD device 1200 may further include an auxiliary power supply 30. The auxiliary power supply 30 may receive power PWR from the host 1100 through a power connector 31 and provide power to the SSD controller 20.

The auxiliary power supply 30 may be placed inside or outside the SSD device 1200. For example, the auxiliary power supply 30 may be placed in a main board and provide auxiliary power to the SSD device 1200.

In some example embodiments, each of the first through n-th nonvolatile memory devices 10-1, 10-2, . . . , 10-n may include a plurality of memory blocks.

In addition, the SSD controller 20 may operate each of the plurality of memory blocks included in the first through n-th nonvolatile memory devices 10-1, 10-2, . . . , 10-n in one of a single level cell (SLC) mode, a multi level cell (MLC) mode, and a triple level cell (TLC) mode.

When a memory block included in one of the first through n-th nonvolatile memory devices 10-1, 10-2, . . . , 10-n operates in the SLC mode, a memory cell included in the memory block may store one bit of data.

When a memory block included in one of the first through n-th nonvolatile memory devices 10-1, 10-2, . . . , 10-n operates in the MLC mode, a memory cell included in the memory block may store two bits of data.

When a memory block included in one of the first through n-th nonvolatile memory devices 10-1, 10-2, . . . , 10-n operates in the TLC mode, a memory cell included in the memory block may store three bits of data.

The SSD controller 20 may store a plurality of data in the first through n-th nonvolatile memory devices 10-1, 10-2, . . . , 10-n. For example, the SSD controller 20 may store data in one or more memory blocks for each of the first through n-th nonvolatile memory devices 10-1, 10-2, . . . , 10-n. As such, the SSD controller 20 may store a plurality of data across a plurality of memory blocks among the first through n-th nonvolatile memory devices 10-1, 10-2, . . . , 10-n. In addition, the SSD controller 20 may distribute the plurality of data in memory blocks operating in the SLC mode, memory blocks operating in the MLC mode, and memory blocks operating in the TLC mode based on an access pattern for each of the plurality of data units stored in the different memory blocks in each of the first through n-th nonvolatile memory devices 10-1, 10-2, . . . , 10-n. For example, data stored in a memory block may refer to data stored in one or more pages in the memory block. For another example, data stored in a memory block may refer to all data stored in that memory block.

The access pattern may be determined, for example, as a number of accesses of a page address or a memory block address corresponding to the data stored in a memory block in each of the first through n-th nonvolatile memory devices 10-1, 10-2, . . . , 10-n.

An operation of the SSD controller 20 will be described in detail later.

Figure 2:
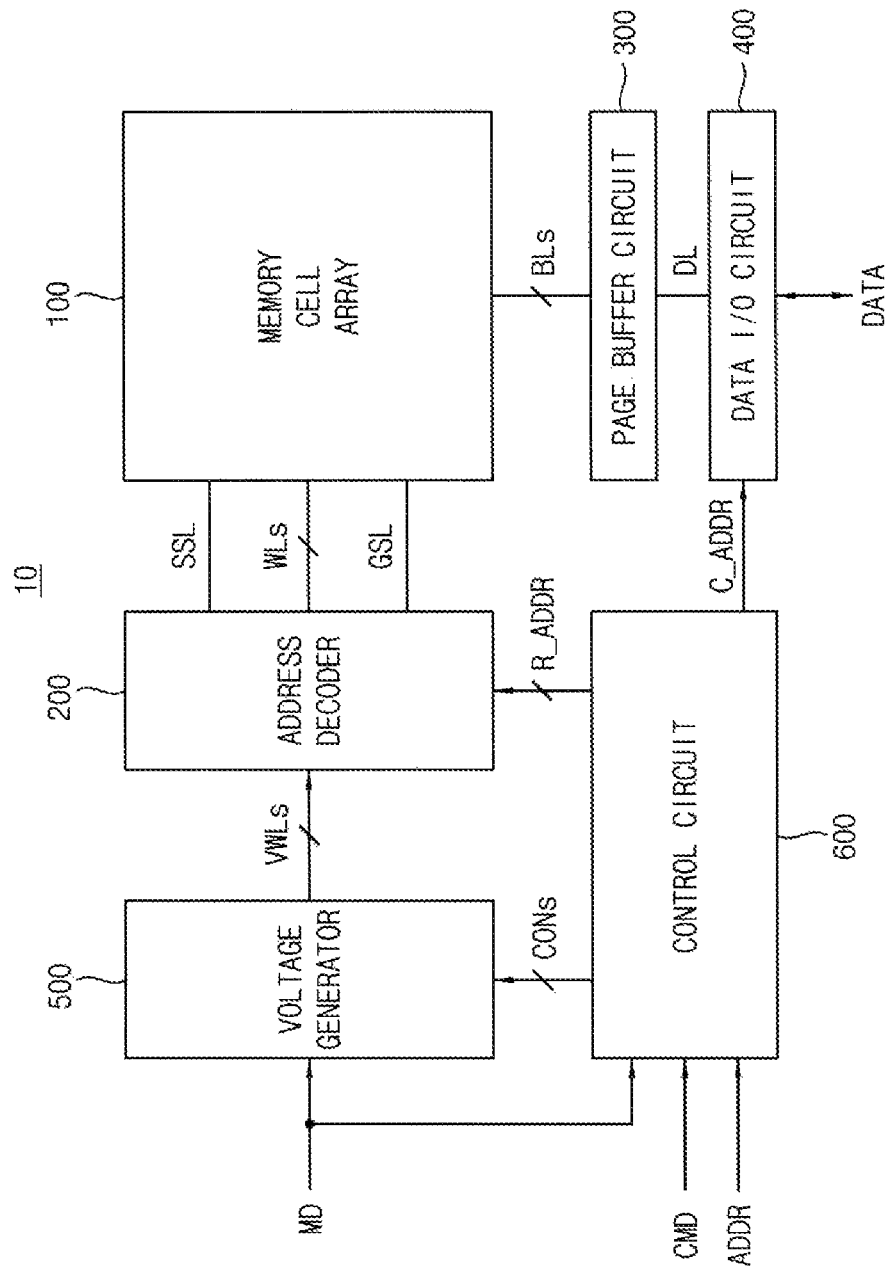
FIG. 2 is a block diagram illustrating an example of a nonvolatile memory device included in a SSD device of FIG. 1.

FIG. 2 is a block diagram illustrating an example of a nonvolatile memory device included in a SSD device of FIG. 1.

Each of the first through n-th nonvolatile memory devices 10-1, 10-2, . . . , 10-*n* included in the SSD device 1200 of FIG. 1 may be implemented with a nonvolatile memory device 10 of FIG. 2.

Referring to FIG. 2, the nonvolatile memory device 10 may include a memory cell array 100, an address decoder 200, a page buffer circuit 300, a data input/output circuit 400, a voltage generator 500, and control circuit 600.

The memory cell array 100 may be coupled to the address decoder 200 through a string selection line SSL, a plurality of word lines WLs, and a ground selection line GSL. In addition, the memory cell array 100 may be coupled to the page buffer circuit 300 through a plurality of bit lines BLs.

The memory cell array 100 may include a plurality of memory blocks. Each of the plurality of memory blocks may include a plurality of memory cells coupled to the plurality of word lines WLs and the plurality of bit lines BLs.

In some example embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other example embodiments, the memory cell array 100 may be a two-dimensional memory cell array, which is formed on a substrate in a two-dimensional structure (or a horizontal structure).

Figure 3:
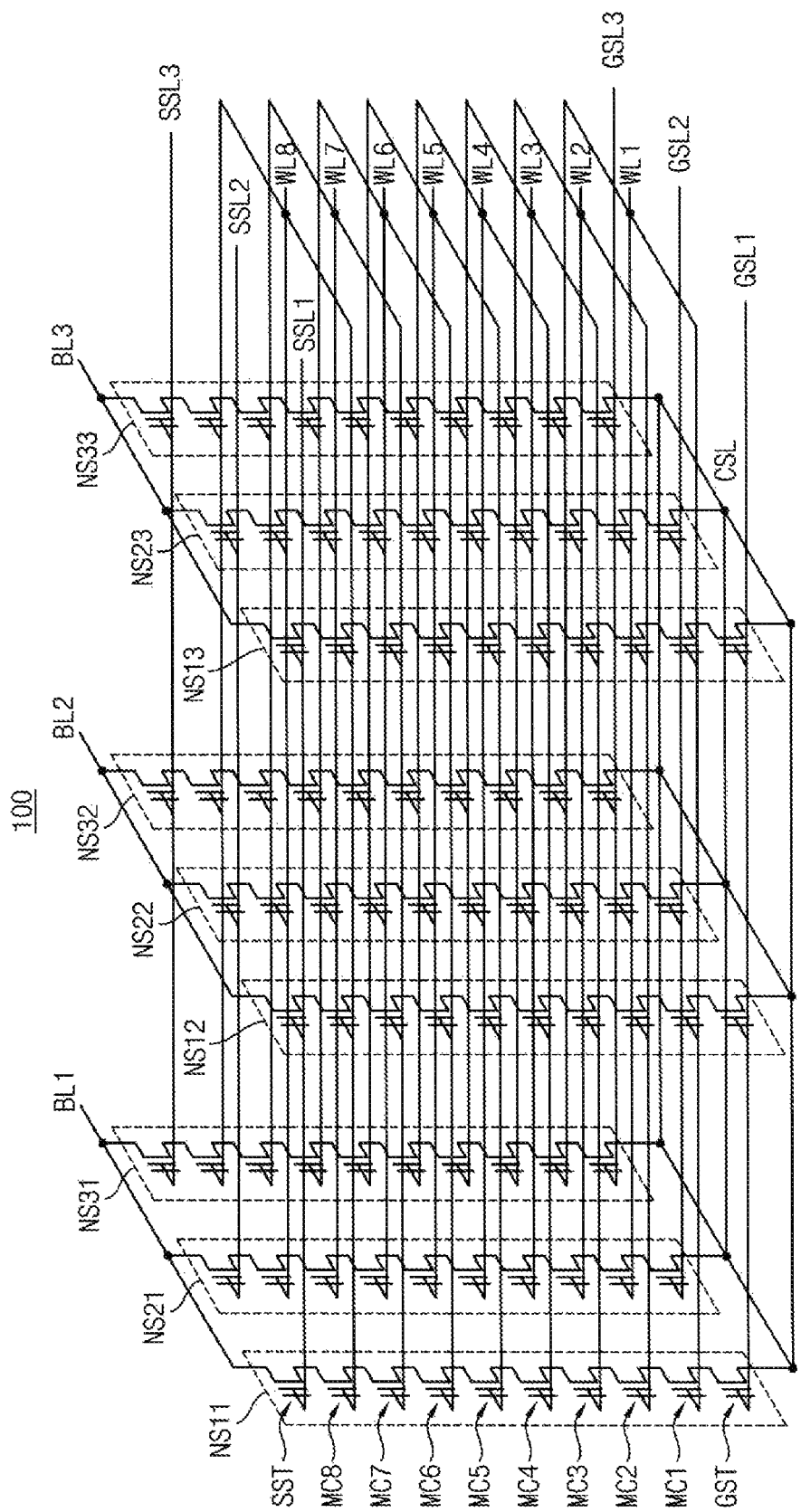
FIG. 3 is a circuit diagram illustrating an example of a memory cell array included in the nonvolatile memory device of FIG. 2.

FIG. 3 is a circuit diagram illustrating an example of a memory cell array included in the nonvolatile memory device of FIG. 2.

One memory block included in the memory cell array 100 is illustrated in FIG. 3.

The memory cell array 100 of FIG. 3 may be formed on a substrate in a three-dimensional structure (or a vertical structure). For example, a plurality of memory cell strings included in the memory cell array 100 may be formed in a direction perpendicular to the substrate.

Referring to FIG. 3, the memory cell array 100 may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 3, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2 and BL3, and the ground selection transistor GST may be connected to the common source line CSL.

Word lines (e.g., WL1) having the same height may be commonly connected, and the ground selection lines GSL1 to GSL3 and the string selection lines SSL1 to SSL3 may be separated.

In FIG. 3, the memory cell array 100 is illustrated to be coupled to eight word lines WL1 to WL8 and three bit lines BL1 to BL3. However, example embodiments are not limited thereto. In some example embodiments, the memory cell array 100 may be coupled to any number of world lines and bit lines.

Referring again to FIG. 2, the control circuit 600 may receive a command signal CMD and an address signal ADDR from the SSD controller 20, and control a program operation, a read operation, and an erase operation of the nonvolatile memory device 10 based on the command signal CMD and the address signal ADDR.

For example, the control circuit 600 may generate control signals CONs, which are used for controlling the voltage generator 500, based on the command signal CMD, and generate a row address R_ADDR and a column address C_ADDR based on the address signal ADDR. The control circuit 600 may provide the row address R_ADDR to the address decoder 200 and provide the column address C_ADDR to the data input/output circuit 400.

In addition, the control circuit 600 may receive a mode signal MD (e.g., a SLC mode signal, a MLC mode signal, and a TLC mode signal) from the SSD controller 20. The control circuit 600 may operate each of the plurality of memory blocks included in the memory cell array 100 in at least one of the SLC mode, the MLC mode, and the TLC mode.

The address decoder 200 may be coupled to the memory cell array 100 through the string selection line SSL, the plurality of word lines WLs, and the ground selection line GSL.

During the program operation or the read operation, the address decoder 200 may determine one of the plurality of word lines WLs as a selected word line and determine the rest of the plurality of word lines WLs except for the selected word line as unselected word lines based on the row address R_ADDR.

The voltage generator 500 may generate word line voltages VWLs, which are required for the operation of the nonvolatile memory device 10, based on the control signals CONs. The word line voltages VWLs may be applied to the plurality of word lines WLs through the address decoder 200.

During the program operation, the voltage generator 500 may generate a program voltage and a program pass voltage. The program voltage may be applied to the selected word line through the address decoder 200, and the program pass voltage may be applied to the unselected word lines through the address decoder 200.

The voltage generator 500 may vary a number of program voltages based on the mode signal MD received from the SSD controller 20.

For example, when the mode signal MD represents the SLC mode, the voltage generator 500 may generate a first program voltage. In this case, each of the plurality of memory cells included in the memory block operating in the SLC mode may store one bit of data through the program operation.

When the mode signal MD represents the MLC mode, the voltage generator 500 may generate first through third program voltages. In this case, each of the plurality of memory cells included in the memory block operating in the MLC mode may store two bits of data through the program operation.

When the mode signal MD represents the TLC mode, the voltage generator 500 may generate first through seventh program voltages. In this case, each of the plurality of memory cells included in the memory block operating in the TLC mode may store three bits of data through the program operation.

During the read operation, the voltage generator 500 may generate a read voltage and a read pass voltage. The read voltage may be applied to the selected word line through the address decoder 200, and the read pass voltage may be applied to the unselected word lines through the address decoder 200.

The voltage generator 500 may vary a number of read voltages based on the mode signal MD received from the SSD controller 20.

For example, when the mode signal MD represents the SLC mode, the voltage generator 500 may generate a first read voltage. In this case, the read operation on memory cells included in the memory block operating in the SLC mode may be performed based on the first read voltage.

Figure 4:
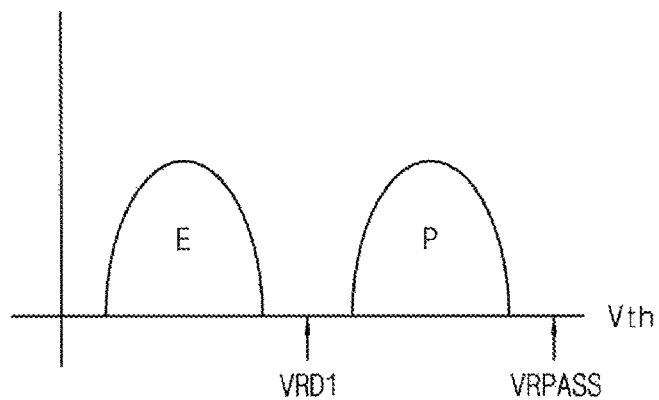
FIG. 4 is a diagram for describing a read operation performed on a memory block operating in a single level cell (SLC) mode.

FIG. 4 is a diagram for describing a read operation performed on a memory block operating in a single level cell (SLC) mode.

In FIG. 4, x-axis represents a threshold voltage of the memory cells included in the memory block operating in the SLC mode, and y-axis represents a number of memory cells.

As illustrated in FIG. 4, when the memory block operates in the SLC mode, the memory cells of the memory block operating in the SLC mode may have one of an erase state E and a program state P.

In this case, during the read operation, a state of each of the memory cells may be determined based on the first read voltage VRD1.

During the read operation, the read pass voltage VRPASS having a sufficiently high voltage may be applied to the unselected word lines such that the memory cells coupled to the unselected word lines may be turned on regardless of the states E and P.

Referring again to FIG. 2, when the mode signal MD represents the MLC mode, the voltage generator 500 may generate first through third read voltages. In this case, the read operation on the memory block operating in the MLC mode may be performed based on the first through third read voltages.

Figure 5:
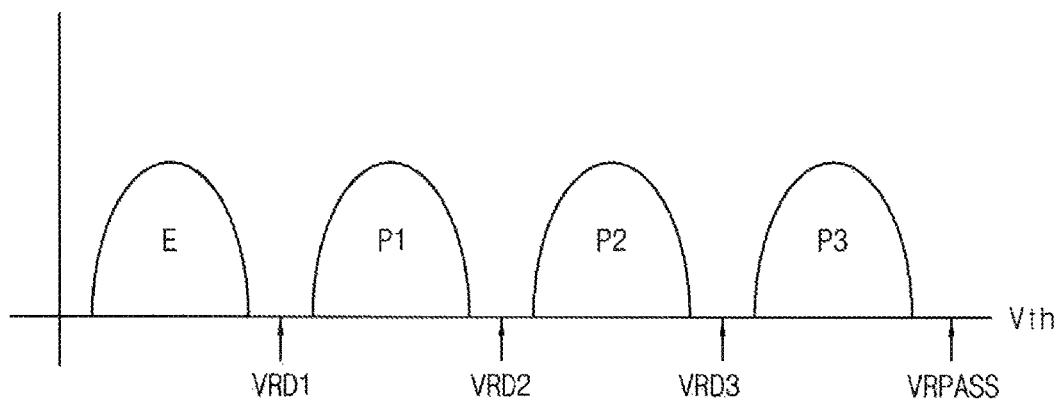
FIG. 5 is a diagram for describing a read operation performed on a memory block operating in a multi level cell (MLC) mode.

FIG. 5 is a diagram for describing a read operation performed on a memory block operating in a multi level cell (MLC) mode.

In FIG. 5, x-axis represents a threshold voltage of the memory cells included in the memory block operating in the MLC mode, and y-axis represents a number of memory cells.

As illustrated in FIG. 5, when the memory block operates in the MLC mode, the memory cells of the memory block operating in the MLC mode may have one of an erase state E, a first program state P1, a second program state P2, and a third program state P3.

In this case, during the read operation, a state of each of the memory cells may be determined based on the first through third read voltages VRD1, VRD2, and VRD3.

During the read operation, the read pass voltage VRPASS having a sufficiently high voltage may be applied to the unselected word lines such that the memory cells coupled to the unselected word lines may be turned on regardless of the states E, P1, P2, and P3.

Referring again to FIG. 2, when the mode signal MD represents the TLC mode, the voltage generator 500 may generate first through seventh read voltages. In this case, the read operation on the memory block operating in the TLC mode may be performed based on the first through seventh read voltages.

Figure 6:
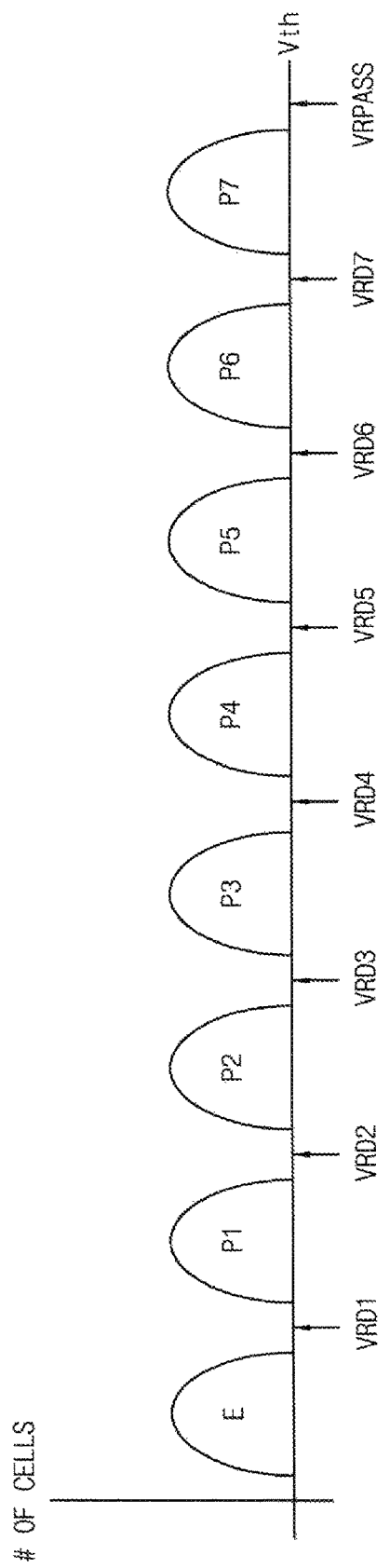
FIG. 6 is a diagram for describing a read operation performed on a memory block operating in a triple level cell (TLC) mode.

FIG. 6 is a diagram for describing a read operation performed on a memory block operating in a triple level cell (TLC) mode.

In FIG. 6, x-axis represents a threshold voltage of the memory cells included in the memory block operating in the TLC mode, and y-axis represents a number of memory cells.

As illustrated in FIG. 6, when the memory block operates in the TLC mode, the memory cells of the memory block operating in the TLC mode may have one of an erase state E, a first program state P1, a second program state P2, a third program state P3, a fourth program state P4, a fifth program state P5, a sixth program state P6, and a seventh program state P7.

In this case, during the read operation, a state of each of the memory cells may be determined based on the first through seventh read voltages VRD1, VRD2, VRD3, VRD4, VRD5, VRD6, and VRD7.

During the read operation, the read pass voltage VRPASS having a sufficiently high voltage may be applied to the unselected word lines such that the memory cells coupled to the unselected word lines may be turned on regardless of the states E, P1, P2, P3, P4, P5, P6, and P7.

Referring again to FIG. 2, the page buffer circuit 300 may be coupled to the memory cell array 100 through the plurality of bit lines BLs.

The page buffer circuit 300 may include a plurality of page buffers. In some example embodiments, one page buffer may be connected to one bit line. In other example embodiments, one page buffer may be connected to two or more bit lines.

The page buffer circuit 300 may temporarily store data to be programmed in a selected page or data read out from the selected page. The selected page may represent a selected word line.

The data input/output circuit 400 may be coupled to the page buffer circuit 300 through data lines DL.

During the program operation, the data input/output circuit 400 may receive program data DATA from the SSD controller 20 and provide the program data DATA to the page buffer circuit 300 based on the column address C_ADDR received from the control circuit 600.

During the read operation, the data input/output circuit 400 may provide read data DATA, which are stored in the page buffer circuit 300, to the SSD controller 20 based on the column address C_ADDR received from the control circuit 600.

Figure 7:
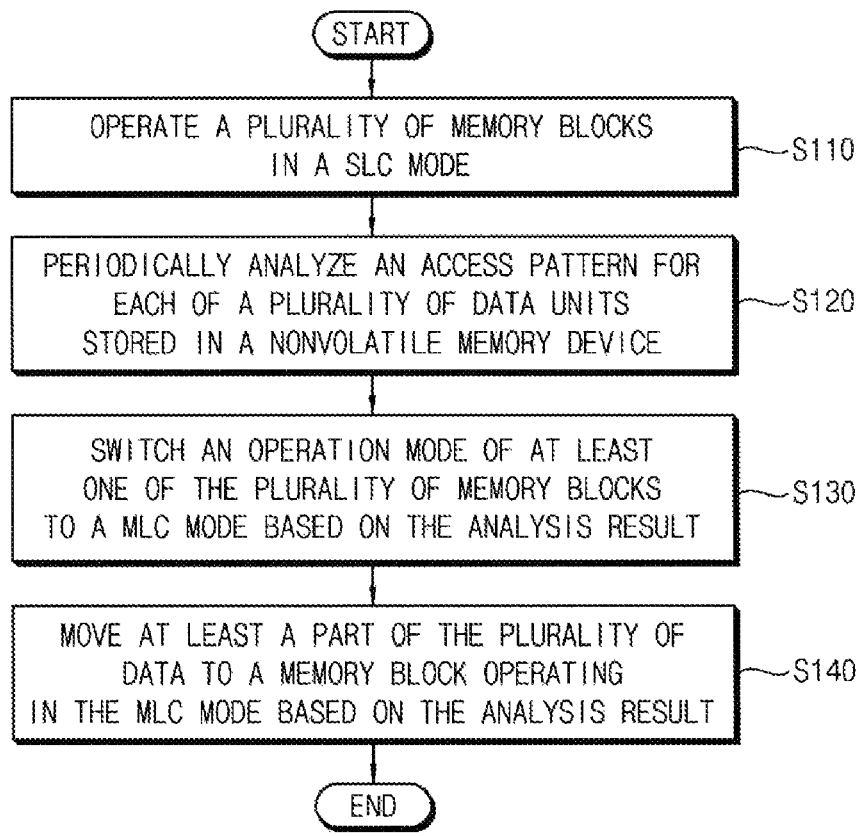
FIG. 7 is a flow chart illustrating a method of operating a SSD device according to example embodiments.

FIG. 7 is a flow chart illustrating a method of operating a SSD device according to example embodiments.

The method of operating a SSD device of FIG. 7 may be performed by the SSD device 1200 of FIG. 1.

Hereinafter, the method of operating the SSD device 1200 will be described with reference to FIGS. 1 to 7.

In an initial stage of an operation of the SSD device 1200, the SSD controller 20 may operate the plurality of memory blocks included in each of the first through n-th nonvolatile memory devices 10-1, 10-2, . . . , 10-n in the SLC mode (step S110).

After that, the SSD controller 20 may perform a normal operation (e.g., a program operation and a read operation) based on the command received from the host 1100. For example, the SSD controller 20 may perform a program operation and a read operation on the first through n-th nonvolatile memory devices 10-1, 10-2, . . . , 10-n based on the command received from the host 1100. Therefore, data may be stored in each of the first through n-th nonvolatile memory devices 10-1, 10-2, . . . , 10-n.

While performing the normal operation, the SSD controller 20 may periodically analyze an access pattern for each of a plurality of data units stored in a plurality of memory blocks in each of the first through n-th nonvolatile memory devices 10-1, 10-2, . . . , 10-n (step S120). The data unit refers to a set of data, such as a number of bits of data (e.g., a page of data).

In example embodiments, the SSD controller 20 may periodically analyze an access pattern for a plurality of data units stored in one or more memory blocks of one or more nonvolatile memory devices.

In example embodiments, the SSD controller 20 may periodically analyze an access pattern for a plurality of data units stored in a plurality of memory blocks in a nonvolatile memory device.

In example embodiments, the SSD controller 20 may analyze an access pattern for each of a plurality of data units stored in a memory block in each of the first through n-th nonvolatile memory devices 10-1, 10-2, . . . , 10-n in a predetermined period of time during performing the normal operation.

Figure 8:
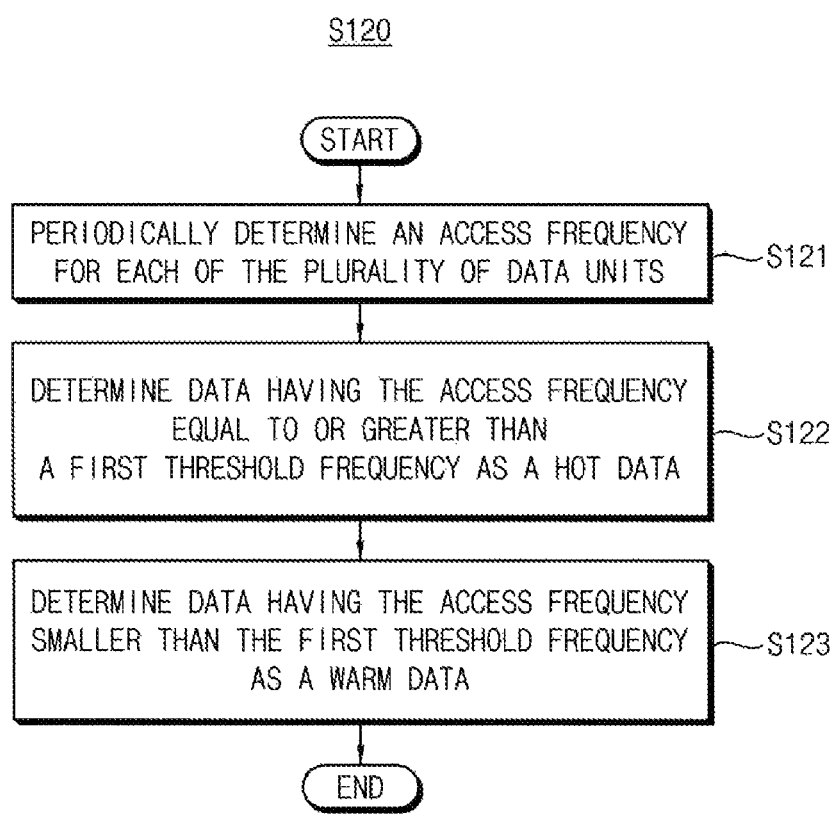
FIG. 8 is a flow chart illustrating an example of a process of periodically analyzing an access pattern for each of a plurality of data units stored in a plurality of memory block of a nonvolatile memory device of FIG. 7.

FIG. 8 is a flow chart illustrating an example of a process of periodically analyzing an access pattern for each of a plurality of data units stored in a plurality of memory blocks of a nonvolatile memory device (step S120) of FIG. 7. Each unit of data or data set can be, for example, a page of data, or a block of data.

Referring to FIG. 8, the SSD controller 20 may periodically determine an access frequency for each of the plurality of data units stored in a memory block in each of the first through n-th nonvolatile memory devices 10-1, 10-2, . . . , 10-n (step S121).

The SSD controller 20 may determine data units having the access frequency (i.e., a number of accesses) equal to or greater than a first threshold frequency (i.e., a first reference value) as a hot data (step S122). The access frequency may be determined in a predetermined period of time during the normal operation (e.g., a program operation and a read operation) of the nonvolatile memory device.

The SSD controller 20 may determine data units having the access frequency smaller than the first threshold frequency as a warm data (step S123).

Referring again to FIG. 7, the SSD controller 20 may switch an operation mode of at least one of the plurality of memory blocks included in the first through n-th nonvolatile memory devices 10-1, 10-2, . . . , 10-n to the MLC mode based on the analysis result (step S130), and move at least one of the plurality of data units stored in the memory block operating in the SLC mode to the memory block operating in the MLC mode based on the analysis result (step S140).

Figure 9:
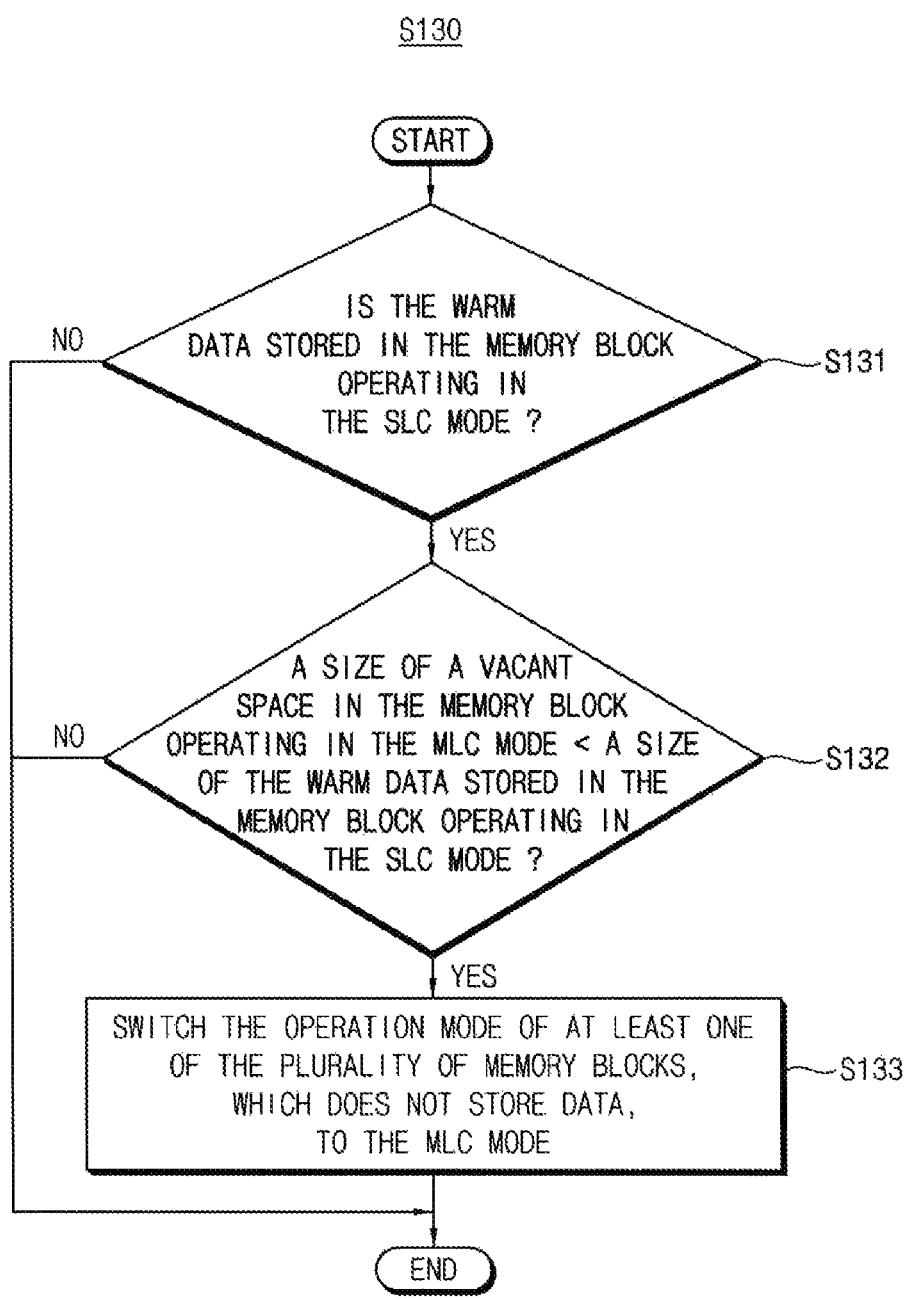
FIG. 9 is a flow chart illustrating an example of a process of switching an operation mode of at least one of a plurality of memory blocks to the MLC mode of FIG. 7.

FIG. 9 is a flow chart illustrating an example of a process of switching an operation mode of at least one of a plurality of memory blocks to the MLC mode (step S130) of FIG. 7.

Referring to FIG. 9, the SSD controller 20 may determine whether the warm data is stored in the memory block operating in the SLC mode (step S131).

When the warm data is not stored in the memory block operating in the SLC mode (step S131; NO), the SSD controller 20 may maintain the operation mode of the plurality of memory blocks included in each of the first through n-th nonvolatile memory devices 10-1, 10-2, . . . , 10-n.

When the warm data is stored in the memory block operating in the SLC mode (step S131; YES), the SSD controller 20 may compare a size of a vacant space in the memory block operating in the MLC mode with a size of the warm data stored in the memory block operating in the SLC mode (step S132).

When the size of the vacant space in the memory block operating in the MLC mode is equal to or greater than the size of the warm data stored in the memory block operating in the SLC mode (step S132; NO), the SSD controller 20 may maintain the operation mode of the plurality of memory blocks included in each of the first through n-th nonvolatile memory devices 10-1, 10-2, . . . , 10-n.

When no memory block among the plurality of memory blocks included in each of the first through n-th nonvolatile memory devices 10-1, 10-2, . . . , 10-n operates in the MLC mode or the size of the vacant space in the memory block operating in the MLC mode is smaller than the size of the warm data stored in the memory block operating in the SLC mode (step S132; YES), the SSD controller 20 may switch the operation mode of at least one of the plurality of memory blocks, which does not store data (e.g., an erase state), to the MLC mode (step S133).

After that, the SSD controller 20 may move the warm data stored in the memory block operating in the SLC mode to the vacant space in the memory block operating in the MLC mode.

Figure 10:
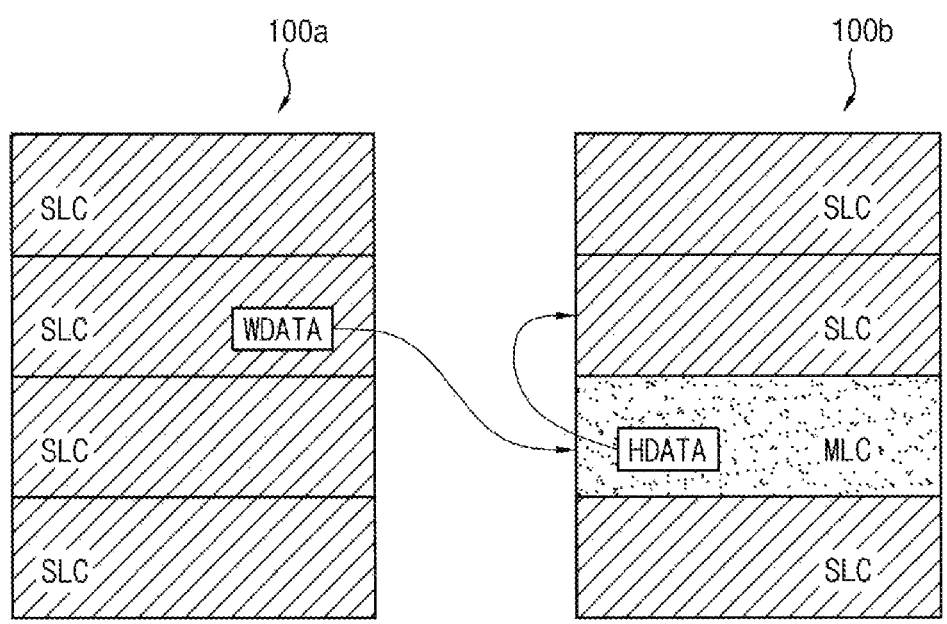
FIG. 10 is a diagram for describing the method of operating the SSD device of FIG. 7.

FIG. 10 is a diagram for describing the method of operating the SSD device of FIG. 7.

A first memory cell array 100a and a second memory cell array 100b included in the SSD device 1200 is illustrated in FIG. 10 as an example.

In FIG. 10, all of the plurality of memory blocks included in the first memory cell array 100a operates in the SLC mode, one of the plurality of memory blocks included in the second memory cell array 100b operates in the MLC mode, and rest of the plurality of memory blocks included in the second memory cell array 100b operates in the SLC mode.

As illustrated in FIG. 10, the SSD controller 20 may move the warm data WDATA stored in the memory block of the first memory cell array 100a operating in the SLC mode to the memory block of the second memory cell array 100b operating in the MLC mode.

In addition, when the hot data HDATA is stored in the memory block of the second memory cell array 100b operating in the MLC mode, the SSD controller 20 may move the hot data HDATA stored in the memory block operating in the MLC mode to the memory block operating in the SLC mode of the second memory cell array 100b.

In one example, if the hot data HDATA is all of the data stored in the memory block storing the hot data HDATA that memory block may be changed to an erase state after the hot data HDATA are moved. In another example, if the hot data HDATA are data stored in one or more pages in the memory block but does not comprise all of the data stored in the memory block, the one or more pages string the hot data HDATA may be changed to an erase state after the hot data HDATA are moved.

As described above with reference to FIGS. 1 to 10, the hot data HDATA may represent data having a relatively high read frequency, and the warm data WDATA may represent data having a relatively low read frequency.

In the method of operating the SSD device according to example embodiments, the SSD controller 20 may switch the operation mode of the plurality of memory blocks between the SLC mode and the MLC mode while performing the normal operation such that the SSD controller 20 may move the hot data HDATA stored in the memory block operating in the MLC mode to the memory block operating in the SLC mode, and move the warm data WDATA stored in the memory block operating in the SLC mode to the memory block operating in the MLC mode.

Generally, an operation speed (e.g., in a read operation) of a memory block in the SLC mode is faster than the operation speed of a memory block in the MLC mode. In addition, a size of a physical space required to store data in a memory block operating in the MLC mode is smaller than a size of a physical space required to store the same data in a memory block operating in the SLC mode.

Therefore, in the method of operating the SSD device according to example embodiments, the hot data HDATA may be moved to the memory block operating in the SLC mode and the warm data WDATA may be moved to the memory block operating in the MLC mode periodically. As such, an overall operation speed of the SSD device 1200 may be increased while an effective storage capacity of the SSD device 1200 is increased.

Figure 11:
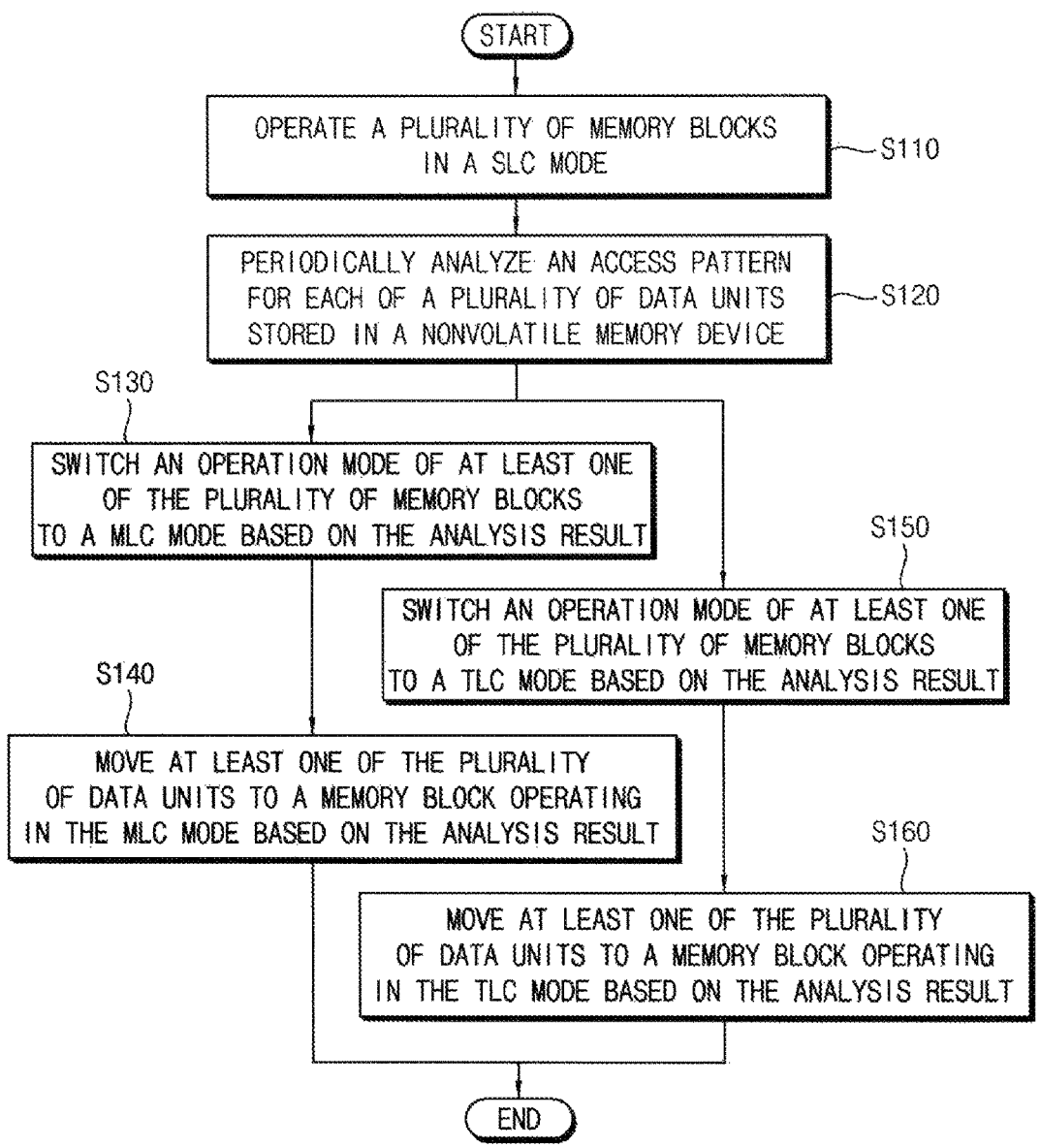
FIG. 11 is a flow chart illustrating a method of operating a SSD device according to example embodiments.

FIG. 11 is a flow chart illustrating a method of operating a SSD device according to example embodiments.

The method of operating a SSD device of FIG. 11 may be performed by the SSD device 1200 of FIG. 1.

Hereinafter, the method of operating the SSD device 1200 will be described with reference to FIGS. 1 to 6 and 11.

Referring to FIG. 11, in an initial stage of an operation of the SSD device 1200, the SSD controller 20 may operate the plurality of memory blocks included in each of the first through n-th nonvolatile memory devices 10-1, 10-2, . . . , 10-n in the SLC mode (step S110).

After that, the SSD controller 20 may perform a normal operation (e.g., a program operation and a read operation) based on the command received from the host 1100. For example, the SSD controller 20 may perform a program operation and a read operation on the first through n-th nonvolatile memory devices 10-1, 10-2, . . . , 10-n based on the command received from the host 1100. Therefore, data may be stored in a memory block in each of the first through n-th nonvolatile memory devices 10-1, 10-2, . . . , 10-n.

While performing the normal operation, the SSD controller 20 may periodically analyze an access pattern for each of the plurality of data units stored in one or more memory blocks in one of the first through n-th nonvolatile memory devices 10-1, 10-2, . . . , 10-n (step S120).

Figure 12:
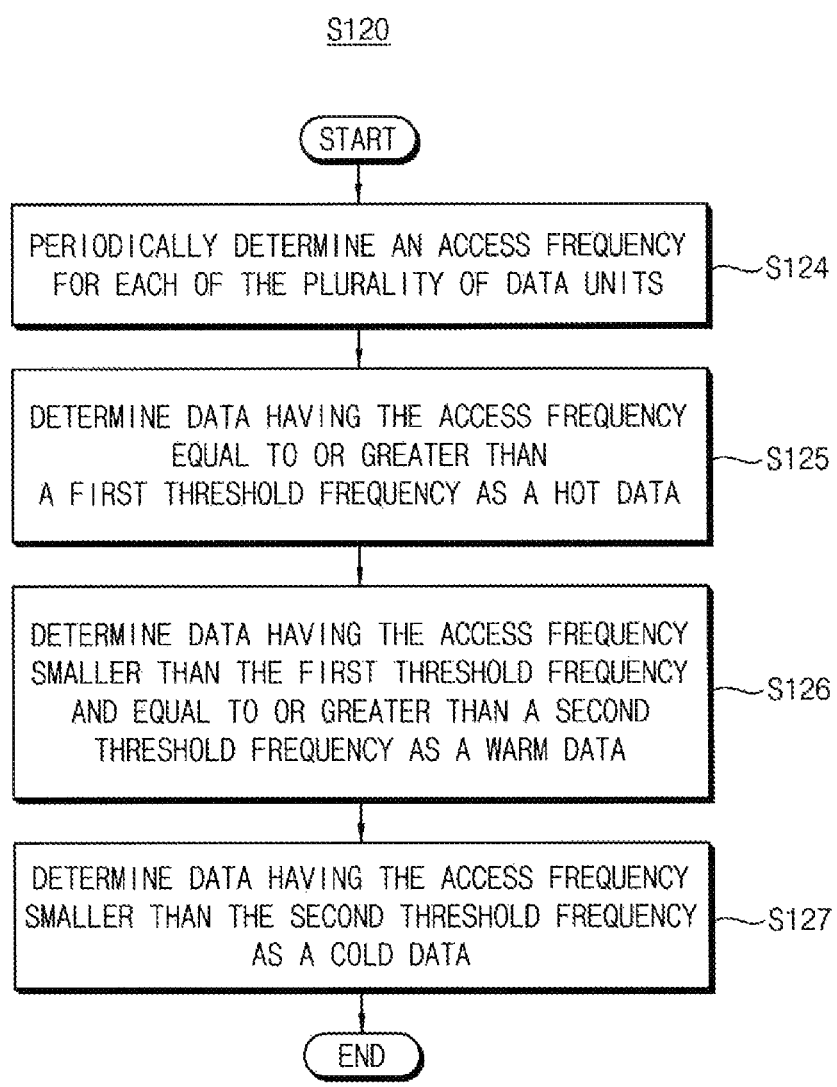
FIG. 12 is a flow chart illustrating an example of a process of periodically analyzing an access pattern for each of a plurality of data units of FIG. 11.

FIG. 12 is a flow chart illustrating an example of a process of periodically analyzing an access pattern for each of the plurality of data units stored in one or more memory blocks of a nonvolatile memory device of FIG. 11.

Referring to FIG. 12, the SSD controller 20 may periodically determine an access frequency for each of the plurality of data units stored in one or more memory blocks in each of the first through n-th nonvolatile memory devices 10-1, 10-2, . . . , 10-n (step S124).

The SSD controller 20 may determine data having the access frequency equal to or greater than a first threshold frequency (i.e., a first reference value) as a hot data (step S125).

The SSD controller 20 may determine data having the access frequency smaller than the first threshold frequency and equal to or greater than a second threshold frequency (i.e., a second reference value) as a warm data (step S126).

The SSD controller 20 may determine data having the access frequency smaller than the second threshold frequency as a cold data (step S127).

Referring again to FIG. 11, the SSD controller 20 may switch an operation mode of at least one of the plurality of memory blocks included in each of the first through n-th nonvolatile memory devices 10-1, 10-2, . . . , 10-n to the MLC mode based on the analysis result (step S130), and move at least one of the plurality of data units stored in the memory block operating in the SLC mode to the memory block operating in the MLC mode based on the analysis result (step S140).

Figure 13:
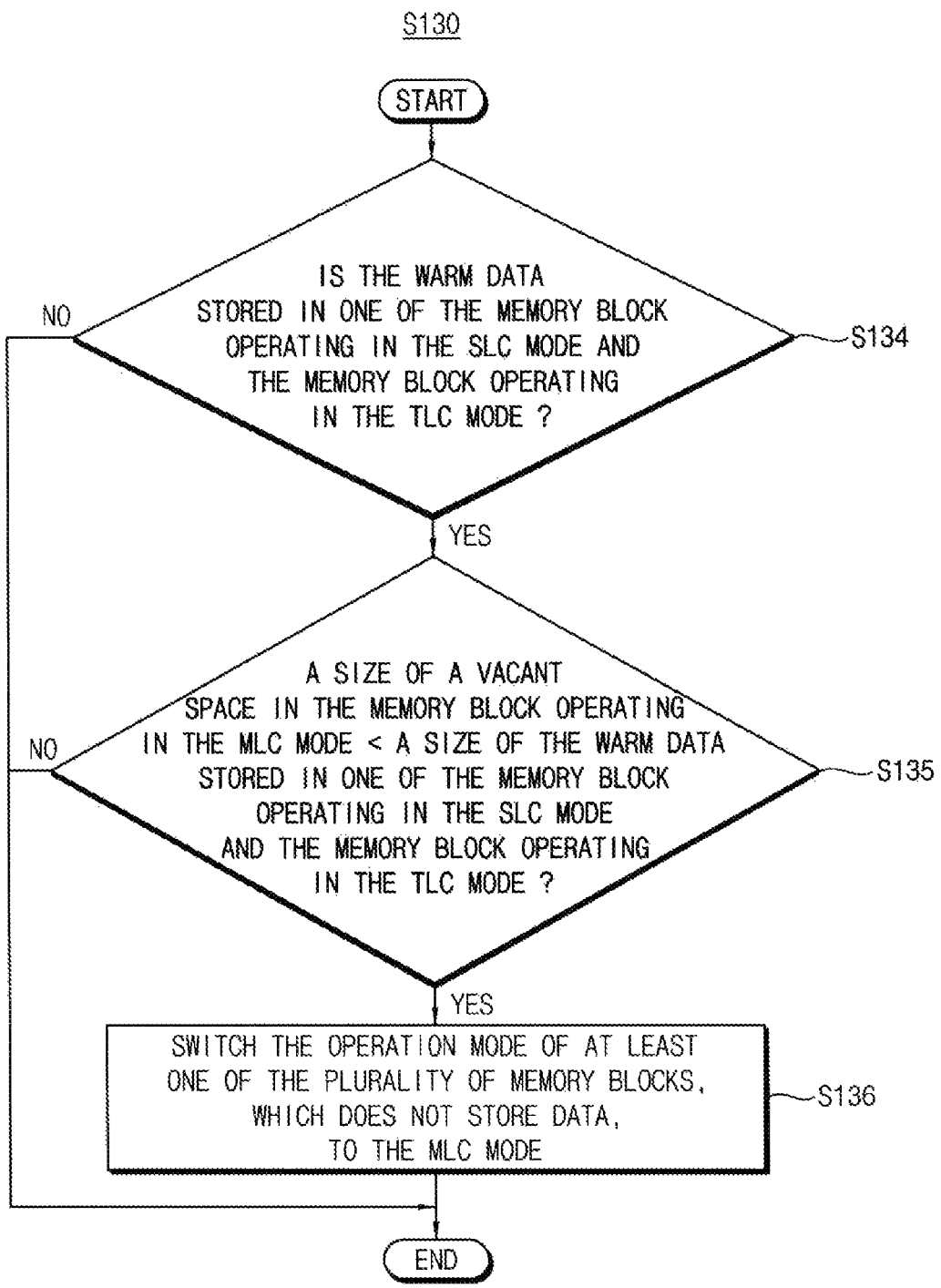
FIG. 13 is a flow chart illustrating an example of a process of switching an operation mode of at least one of a plurality of memory blocks to the MLC mode of FIG. 11.

FIG. 13 is a flow chart illustrating an example of a process of switching an operation mode of at least one of a plurality of memory blocks to the MLC mode of FIG. 11.

Referring to FIG. 13, the SSD controller 20 may determine whether the warm data is stored in one of the memory block operating in the SLC mode and the memory block operating in the TLC mode (step S134).

When the warm data is not stored in one of the memory block operating in the SLC mode and the memory block operating in the TLC mode (step S134; NO), the SSD controller 20 may maintain the operation mode of the plurality of memory blocks included in each of the first through n-th nonvolatile memory devices 10-1, 10-2, . . . , 10-n.

When the warm data is stored in one of the memory block operating in the SLC mode and the memory block operating in the TLC mode (step S134; YES), the SSD controller 20 may compare a size of a vacant space in the memory block operating in the MLC mode with a size of the warm data stored in one of the memory block operating in the SLC mode and the memory block operating in the TLC mode (step S135).

When the size of the vacant space in the memory block operating in the MLC mode is equal to or greater than the size of the warm data stored in one of the memory block operating in the SLC mode and the memory block operating in the TLC mode (step S135; NO), the SSD controller 20 may maintain the operation mode of the plurality of memory blocks included in each of the first through n-th nonvolatile memory devices 10-1, 10-2, . . . , 10-n.

When no memory block among the plurality of memory blocks included in the first through n-th nonvolatile memory devices 10-1, 10-2, . . . , 10-n operates in the MLC mode or the size of the vacant space in the memory block operating in the MLC mode is smaller than the size of the warm data stored in one of the memory block operating in the SLC mode and the memory block operating in the TLC mode (step S135; YES), the SSD controller 20 may switch the operation mode of at least one of the plurality of memory blocks, which does not store data (e.g., an erase state), to the MLC mode (step S136).

After that, the SSD controller 20 may move the warm data stored in one of the memory block operating in the SLC mode and the memory block operating in the TLC mode to the vacant space in the memory block operating in the MLC mode.

Referring again to FIG. 11, the SSD controller 20 may switch an operation mode of at least one of the plurality of memory blocks included in at least one of the first through n-th nonvolatile memory devices 10-1, 10-2, . . . , 10-n to the TLC mode based on the analysis result (step S150), and move at least one of the plurality of data units stored in the memory block operating in the SLC mode to the memory block operating in the TLC mode based on the analysis result (step S160).

Figure 14:
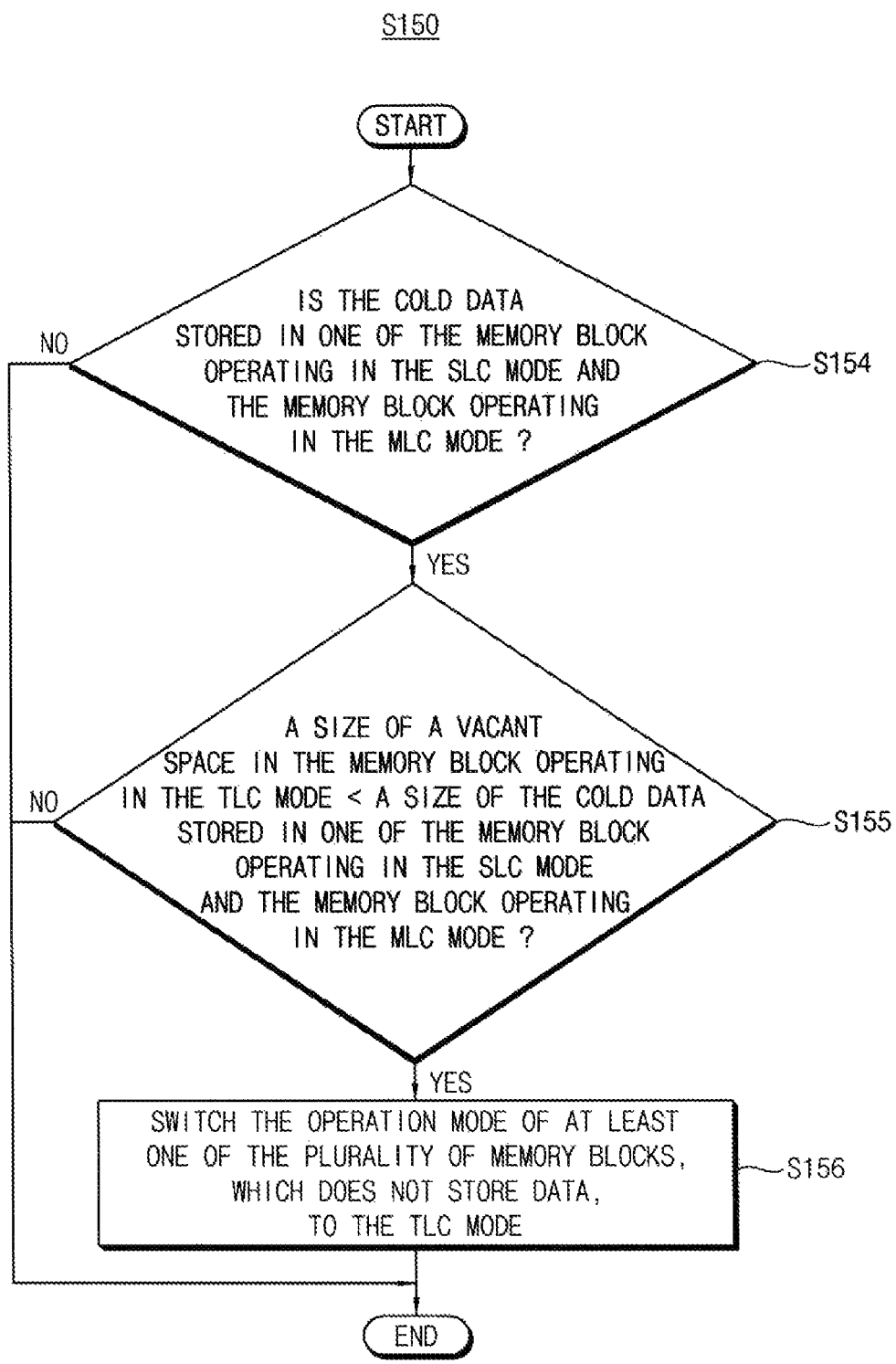
FIG. 14 is a flow chart illustrating an example of a process of switching an operation mode of at least one of a plurality of memory blocks to the TLC mode of FIG. 11.

FIG. 14 is a flow chart illustrating an example of a process of switching an operation mode of at least one of a plurality of memory blocks to the TLC mode of FIG. 11.

Referring to FIG. 14, the SSD controller 20 may determine whether the cold data is stored in one of the memory block operating in the SLC mode and the memory block operating in the MLC mode (step S154).

When the cold data is not stored in one of the memory block operating in the SLC mode and the memory block operating in the MLC mode (step S154; NO), the SSD controller 20 may maintain the operation mode of the plurality of memory blocks included in each of the first through n-th nonvolatile memory devices 10-1, 10-2, . . . , 10-n.

When the cold data is stored in one of the memory block operating in the SLC mode and the memory block operating in the MLC mode (step S154; YES), the SSD controller 20 may compare a size of a vacant space in the memory block operating in the TLC mode with a size of the cold data stored in one of the memory block operating in the SLC mode and the memory block operating in the MLC mode (step S155).

When the size of the vacant space in the memory block operating in the TLC mode is equal to or greater than the size of the cold data stored in one of the memory block operating in the SLC mode and the memory block operating in the MLC mode (step S155; NO), the SSD controller 20 may maintain the operation mode of the plurality of memory blocks included in each of the first through n-th nonvolatile memory devices 10-1, 10-2, . . . , 10-n.

When no memory block among the plurality of memory blocks included in each of the first through n-th nonvolatile memory devices 10-1, 10-2, . . . , 10-n operates in the TLC mode or the size of the vacant space in the memory block operating in the TLC mode is smaller than the size of the cold data stored in one of the memory block operating in the SLC mode and the memory block operating in the MLC mode (step S155; YES), the SSD controller 20 may switch the operation mode of at least one of the plurality of memory blocks, which does not store data (e.g., an erase state), to the TLC mode (step S156).

After that, the SSD controller 20 may move the cold data stored in one of the memory block operating in the SLC mode and the memory block operating in the MLC mode to the vacant space in the memory block operating in the TLC mode.

As described above with reference to FIGS. 11 to 14, the hot data may represent data having a relatively high read frequency, the warm data may represent data having a moderate read frequency, and the cold data may represent data having a relatively low read frequency.

In the method of operating the SSD device according to example embodiments, the SSD controller 20 may switch the operation mode of the plurality of memory blocks among the SLC mode, the MLC mode, and the TLC mode while performing the normal operation such that the SSD controller 20 may move the hot data to the memory block operating in the SLC mode, move the warm data to the memory block operating in the MLC mode, and move the cold data to the memory block operating in the TLC mode.

Generally, an operation speed of a memory block in the SLC mode is faster than an operation speed of a memory block in the MLC mode, and an operation speed of a memory block in the MLC mode is faster than an operation speed of a memory block in the TLC mode. In addition, a size of a physical space required to store data in a memory block operating in the MLC mode is smaller than a size of a physical space required to store the same data in a memory block operating in the SLC mode, and a size of a physical space required to store data in a memory block operating in the TLC mode is smaller than a size of a physical space required to store the same data in a memory block operating in the MLC mode.

Therefore, in the method of operating the SSD device according to example embodiments, the hot data may be moved to the memory block operating in the SLC mode, the warm data may be moved to the memory block operating in the MLC mode, and the cold data may be moved to the memory block operating in the TLC mode periodically. As such, an overall operation speed of the SSD device 1200 may be increased while an effective storage capacity of the SSD device 1200 is further increased.

Figure 15:
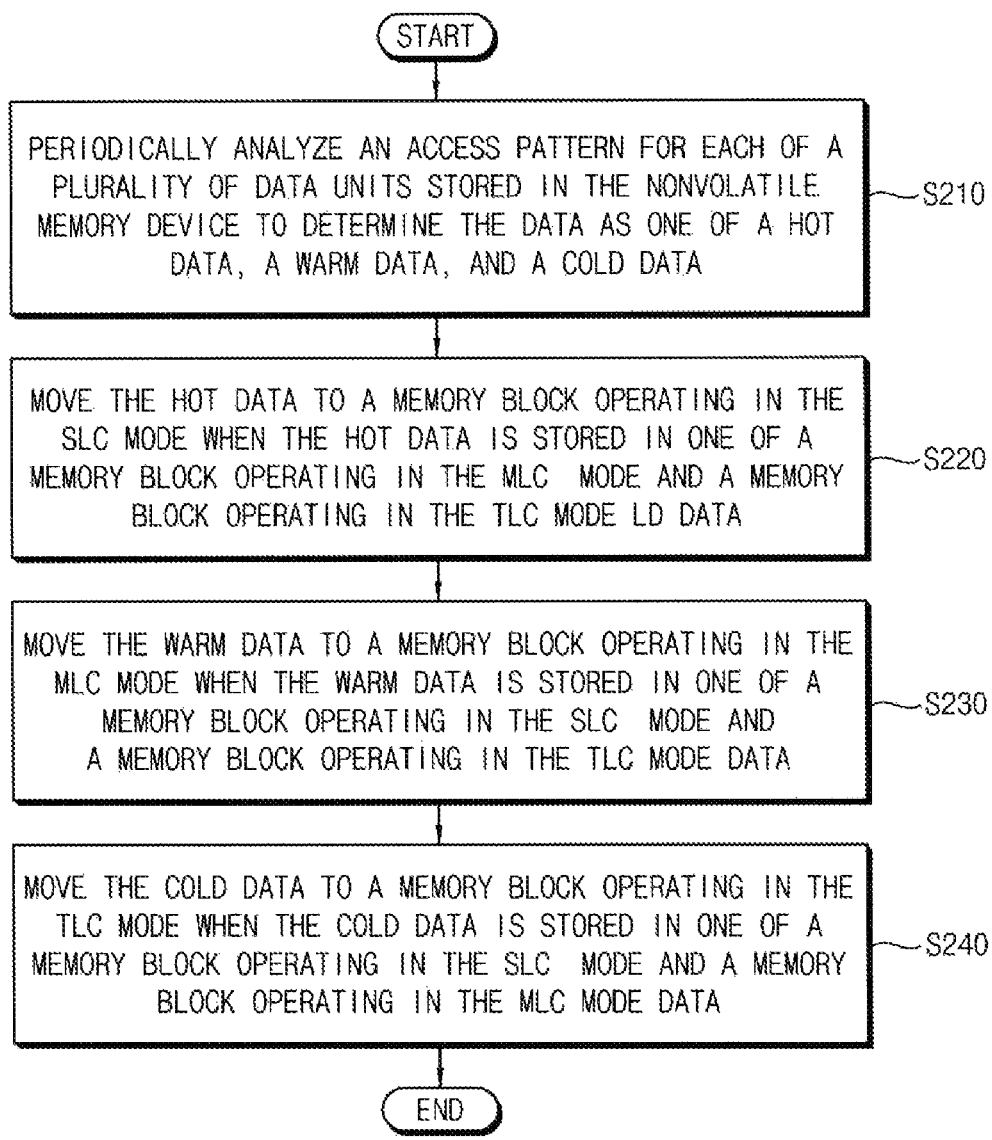
FIG. 15 is a flow chart illustrating a method of operating a SSD device according to example embodiments.

FIG. 15 is a flow chart illustrating a method of operating a SSD device according to example embodiments.

The method of operating a SSD device of FIG. 15 may be performed by the SSD device 1200 of FIG. 1.

Hereinafter, the method of operating the SSD device 1200 will be described with reference to FIGS. 1 to 6 and 15.

Referring to FIG. 15, the SSD controller 20 may periodically analyze an access pattern for each of the plurality of data units stored in a memory block in each of the first through n-th nonvolatile memory devices 10-1, 10-2, . . . , 10-n to determine the data as one of the hot data, the warm data, and the cold data (step S210).

For example, the SSD controller 20 may determine the data as one of the hot data, the warm data, and the cold data through the process of FIG. 12.

After that, when the hot data is stored in one of the memory blocks operating in the MLC mode and the memory block operating in the TLC mode among the plurality of memory blocks, the SSD controller 20 may move the hot data to the vacant space in the memory block operating in the SLC mode among the plurality of memory blocks (step S220).

For example, when the size of the vacant space in the memory block operating in the SLC mode is smaller than the size of the hot data stored in one of the memory block operating in the MLC mode and the memory block operating in the TLC mode, the SSD controller 20 may switch the operation mode of at least one of the plurality of memory blocks, which does not store data (e.g., an erase state), to the SLC mode, and then move the hot data stored in one of the memory block operating in the MLC mode and the memory block operating in the TLC mode to the vacant space in the memory block operating in the SLC mode.

When the warm data is stored in one of the memory block operating in the SLC mode and the memory block operating in the TLC mode among the plurality of memory blocks, the SSD controller 20 may move the warm data to the vacant space in the memory block operating in the MLC mode among the plurality of memory blocks (step S230).

For example, when the size of the vacant space in the memory block operating in the MLC mode is smaller than the size of the warm data stored in one of the memory block operating in the SLC mode and the memory block operating in the TLC mode, the SSD controller 20 may switch the operation mode of at least one of the plurality of memory blocks, which does not store data (e.g., an erase state), to the MLC mode, and then move the warm data stored in one of the memory block operating in the SLC mode and the memory block operating in the TLC mode to the vacant space in the memory block operating in the MLC mode.

When the cold data is stored in one of the memory block operating in the SLC mode and the memory block operating in the MLC mode among the plurality of memory blocks, the SSD controller 20 may move the cold data to the vacant space in the memory block operating in the TLC mode among the plurality of memory blocks (step S240).

For example, when the size of the vacant space in the memory block operating in the TLC mode is smaller than the size of the cold data stored in one of the memory block operating in the SLC mode and the memory block operating in the MLC mode, the SSD controller 20 may switch the operation mode of at least one of the plurality of memory blocks, which does not store data (e.g., an erase state), to the TLC mode, and then move the cold data stored in one of the memory block operating in the SLC mode and the memory block operating in the MLC mode to the vacant space in the memory block operating in the TLC mode.

In some example embodiments, in an initial stage of an operation of the SSD device 1200, the SSD controller 20 may operate the plurality of memory blocks included in the first through n-th nonvolatile memory devices 10-1, 10-2, . . . , 10-n in the SLC mode.

Figure 16:
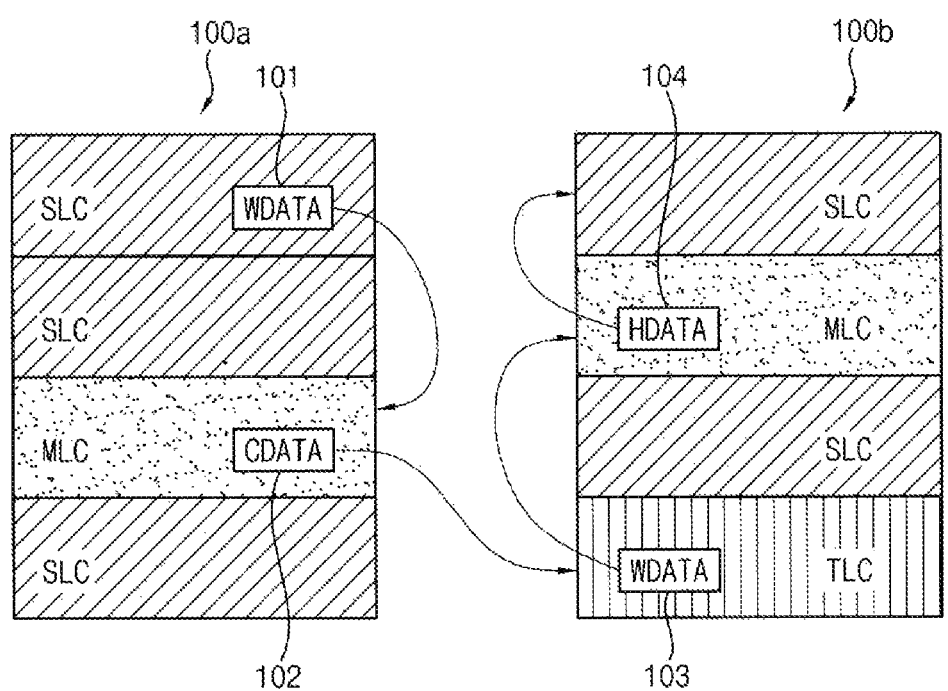
FIG. 16 is a diagram for describing the method of operating the SSD device of FIG. 15.

FIG. 16 is a diagram for describing the method of operating the SSD device of FIG. 15.

A first memory cell array 100a and a second memory cell array 100b included in the SSD device 1200 is illustrated in FIG. 16 as an example.

In FIG. 16, three of the plurality of memory blocks included in the first memory cell array 100a operates in the SLC mode, one of the plurality of memory blocks included in the first memory cell array 100a operates in the MLC mode, two of the plurality of memory blocks included in the second memory cell array 100b operates in the SLC mode, one of the plurality of memory blocks included in the second memory cell array 100b operates in the MLC mode, and one of the plurality of memory blocks included in the second memory cell array 100b operates in the TLC mode.

As illustrated in FIG. 16, the SSD controller 20 may move the warm data WDATA 101 stored in the memory block operating in the SLC mode to the memory block operating in the MLC mode, move the cold data CDATA 102 stored in the memory block operating in the MLC mode to the memory block operating in the TLC mode, move the warm data WDATA 103 stored in the memory block operating in the TLC mode to the memory block operating in the MLC mode, and move the hot data HDATA 104 stored in the memory block operating in the MLC mode to the memory block operating in the SLC mode, In the method of operating the SSD device according to example embodiments, the hot data may be moved to the memory block operating in the SLC mode, the warm data may be moved to the memory block operating in the MLC mode, and the cold data may be moved to the memory block operating in the TLC mode periodically. As such, an overall operation speed of the SSD device 1200 may be increased while an effective storage capacity of the SSD device 1200 is further increased.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a solid state drive (SSD) device, which includes a nonvolatile memory device having a plurality of memory blocks, the method comprising:
   operating the plurality of memory blocks in a single level cell (SLC) mode;
   periodically analyzing an access pattern for each of a plurality of data units stored in each of the plurality of memory blocks of the nonvolatile memory device;
   switching an operation mode of at least one of the plurality of memory blocks to a multi level cell (MLC) mode based on the analysis result; and
   moving at least one of the plurality of data units to a memory block operating in the MLC mode based on the analysis result,
   wherein the periodically analyzing an access pattern for each of a plurality of data units stored in each of the plurality of memory blocks of the nonvolatile memory device includes:
   periodically determining an access frequency for data stored in each of the plurality of memory blocks;
   determining data having the access frequency equal to or greater than a first threshold frequency as a hot data; and
   determining data having the access frequency smaller than the first threshold frequency as a warm data, and
   wherein the switching an operation mode of at least one of the plurality of memory blocks to the MLC mode based on the analysis result includes:
   comparing a size of a vacant space in a memory block operating in the MLC mode with a size of the warm data stored in a memory block operating in the SLC mode when the warm data is stored in the memory block operating in the SLC mode; and
   switching the operation mode of at least one of the plurality of memory blocks, which does not store data, to the MLC mode when the size of the vacant space in the memory block operating in the MLC mode is smaller than the size of the warm data stored in the memory block operating in the SLC mode.

2. The method of claim 1, wherein the moving at least one of the plurality of data units to a memory block operating in the MLC mode based on the analysis result includes:
   moving the warm data stored in a memory block operating in the SLC mode to a vacant space in the memory block operating in the MLC mode.

3. The method of claim 1, further comprising:
   switching an operation mode of at least one of the plurality of memory blocks to a triple level cell (TLC) mode based on the analysis result; and
   moving at least one of the plurality of data units to a memory block operating in the TLC mode based on the analysis result.

4. The method of claim 3, wherein the periodically analyzing an access pattern for each of a plurality of data units stored in each of the plurality of memory blocks of the nonvolatile memory device includes:
   periodically determining an access frequency for data stored in each of the plurality of memory blocks;
   determining data having the access frequency equal to or greater than a first threshold frequency as a hot data;
   determining data having the access frequency smaller than the first threshold frequency and equal to or greater than a second threshold frequency as a warm data; and
   determining data having the access frequency smaller than the second threshold frequency as a cold data.

5. The method of claim 4, wherein the switching an operation mode of at least one of the plurality of memory blocks to the MLC mode based on the analysis result includes:

comparing a size of a vacant space in the memory block operating in the MLC mode with a size of the warm data stored in a memory block operating in the TLC mode when the warm data is stored in the memory block operating in the TLC mode; and switching the operation mode of at least one of the plurality of memory blocks, which does not store data, to the MLC mode when the size of the vacant space in the memory block operating in the MLC mode is smaller than the size of the warm data stored in the memory block operating in the TLC mode.

6. The method of claim 4, wherein the switching an operation mode of at least one of the plurality of memory blocks to the TLC mode based on the analysis result includes:

comparing a size of a vacant space in the memory block operating in the TLC mode with a size of the cold data stored in one of a memory block operating in the SLC mode and the memory block operating in the MLC mode when the cold data is stored in one of the memory block operating in the SLC mode and the memory block operating in the MLC mode; and switching the operation mode of at least one of the plurality of memory blocks, which does not store data, to the TLC mode when the size of the vacant space in the memory block operating in the TLC mode is smaller than the size of the cold data stored in one of the memory block operating in the SLC mode and the memory block operating in the MLC mode.

7. The method of claim 4, wherein the moving at least one of the plurality of data units to a memory block operating in the MLC mode based on the analysis result includes:

moving the warm data stored in one of a memory block operating in the SLC mode and the memory block operating in the TLC mode to a vacant space in the memory block operating in the MLC mode.

8. The method of claim 4, wherein the moving at least one of the plurality of data units to a memory block operating in the TLC mode based on the analysis result includes:

moving the cold data stored in one of a memory block operating in the SLC mode and the memory block operating in the MLC mode to a vacant space in the memory block operating in the TLC mode.

9. A method of operating a solid state drive (SSD) device, which includes a nonvolatile memory device having a plurality of memory blocks, the method comprising:

periodically analyzing an access pattern for each of a plurality of data units stored in the nonvolatile memory device to determine each of the plurality of data units as one of a hot data, a warm data, and a cold data;

moving the hot data to a memory block operating in a single level cell (SLC) mode among the plurality of memory blocks when the hot data is stored in one of a memory block operating in a multi level cell (MLC) mode and a memory block operating in a triple level cell (TLC) mode among the plurality of memory blocks;

moving the warm data to the memory block operating in the MLC mode among the plurality of memory blocks when the warm data is stored in one of the memory block operating in the SLC mode and the memory block operating in the TLC mode among the plurality of memory blocks; and moving the cold data to the memory block operating in the TLC mode among the plurality of memory blocks when the cold data is stored in one of the memory block operating in the SLC mode and the memory block operating in the MLC mode among the plurality of memory blocks, wherein periodically analyzing the access pattern includes periodically determining a number of accesses for one of the data units stored in each of the plurality of memory blocks, wherein the hot data refers to data having a number of accesses equal to or greater than a first reference value, wherein the warm data refers to data having a number of accesses equal to or greater than a second reference number and less than the first reference value, and wherein the cold data refers to data having a number of accesses less than the second reference value, wherein the moving the hot data to a memory block operating in the SLC mode among the plurality of memory blocks when the hot data is stored in one of a memory block operating in the MLC mode and a memory block operating in the TLC mode among the plurality of memory blocks includes:

comparing a size of a vacant space in the memory block operating in the SLC mode with a size of the hot data stored in one of the memory block operating in the MLC mode and the memory block operating in the TLC mode; and switching an operation mode of at least one of the plurality of memory blocks, which does not store data, to the SLC mode when the size of the vacant space in the memory block operating in the SLC mode is smaller than the size of the hot data stored in one of the memory block operating in the MLC mode and the memory block operating in the TLC mode.

10. The method of claim 9, wherein the moving the warm data to the memory block operating in the MLC mode among the plurality of memory blocks when the warm data is stored in one of the memory block operating in the SLC mode and the memory block operating in the TLC mode among the plurality of memory blocks includes:

comparing a size of a vacant space in the memory block operating in the MLC mode with a size of the warm data stored in one of the memory block operating in the SLC mode and the memory block operating in the TLC mode; and switching an operation mode of at least one of the plurality of memory blocks, which does not store data, to the MLC mode when the size of the vacant space in the memory block operating in the MLC mode is smaller than the size of the warm data stored in one of the memory block operating in the SLC mode and the memory block operating in the TLC mode.

11. The method of claim 9, wherein the moving the cold data to the memory block operating in the TLC mode among the plurality of memory blocks when the cold data is stored in one of the memory block operating in the SLC mode and the memory block operating in the MLC mode among the plurality of memory blocks includes:

comparing a size of a vacant space in the memory block operating in the TLC mode with a size of the cold data stored in one of the memory block operating in the SLC mode and the memory block operating in the MLC mode; and switching an operation mode of at least one of the plurality of memory blocks, which does not store data, to the TLC mode when the size of the vacant space in the memory block operating in the TLC mode is smaller than the size of the cold data stored in one of the memory block operating in the SLC mode and the memory block operating in the MLC mode.

12. A method of operating a solid state drive (SSD) device, which includes a nonvolatile memory device having a plurality of memory blocks, the method comprising:
performing a number of accesses for each of a plurality of data units stored in each memory block of the plurality of memory blocks; and
switching an operation mode of at least one of the plurality of memory blocks from one of a single level cell (SLC) mode, a multi level cell (MLC) mode, and a triple level cell (TLC) mode to a different one of the SLC mode, the MLC mode, and the TLC mode based on the number of accesses,
wherein the switching an operation mode of at least one of the plurality of memory blocks, includes:
switching an operation mode of a memory block to the SLC mode when the number of accesses for a first unit of data in a memory block is equal to or greater than a first reference value;
switching an operation mode of a memory block to the MLC mode when the number of accesses for a second unit of data in a memory block is smaller than the first reference value and equal to or greater than a second reference value; and
switching an operation mode of a memory block to the TLC mode when the number of accesses for a third unit of data in a memory block is smaller than the second reference value,
wherein the switching an operation mode of a memory block to the SLC mode, includes:
switching an operation mode of a memory block to the SLC mode when a size of the vacant space in the memory block operating in the SLC mode is smaller than a size of data stored in the memory block operating in one of the MLC mode and the TLC mode; and
moving at least one of the data units stored in the memory block operating in one of the MLC mode and the TLC mode to the memory block operating in the SLC mode when the size of the vacant space in the memory block operating in the SLC mode is equal to or greater than the size of data stored in the memory block operating in one of the MLC mode and the TLC mode.

13. The method of claim 12, wherein one of the data units stored in each memory block includes data of one or more pages of the each memory block.

14. The method of claim 12, further comprising:
moving at least one of the data units stored in a memory block operating in one of the SLC mode, the MLC mode, and the TLC mode to the memory block operating in a different one of the SLC mode, the MLC mode, and the TLC mode based on the number of accesses.

15. The method of claim 12, further comprising:
moving the first unit of data to the memory block operating in the SLC mode when the first unit of data is stored in the memory block operating in one of the MLC mode and the TLC mode;
moving the second unit of data to the memory block operating in the MLC mode when the second unit of data is stored in the memory block operating in one of the SLC mode and the TLC mode; and
moving the third unit of data to the memory block operating in the TLC mode when the third unit of data is stored in the memory block operating in one of the SLC mode and the MLC mode.

* * * * *